United States Patent
Weng et al.

(10) Patent No.: US 7,271,062 B2
(45) Date of Patent: Sep. 18, 2007

(54) NON-VOLATILE MEMORY CELL AND FABRICATING METHOD THEREOF AND METHOD OF FABRICATING NON-VOLATILE MEMORY

(75) Inventors: Meng-Hsuan Weng, Hsinchu (TW); Tzung-Ting Han, Hsinchu (TW); Ming-Shang Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 11/223,690

(22) Filed: Sep. 9, 2005

(65) Prior Publication Data

US 2007/0057317 A1    Mar. 15, 2007

(51) Int. Cl.
*H01L 21/336* (2006.01)
(52) U.S. Cl. .................. 438/257; 438/258; 438/593

(58) Field of Classification Search ........ 438/257–258, 438/593; 257/314–317
See application file for complete search history.

(56) References Cited

U.S. PATENT DOCUMENTS

| 2003/0143790 A1* | 7/2003 | Wu ........................ 438/197 |
| 2005/0085029 A1* | 4/2005 | Ding ....................... 438/202 |
| 2006/0160343 A1* | 7/2006 | Chong et al. ............ 438/593 |

* cited by examiner

*Primary Examiner*—Dung A. Le
(74) *Attorney, Agent, or Firm*—J.C. Patents

(57) ABSTRACT

A method of fabricating a non-volatile memory is provided. In the fabricating method, a plurality of stack gate structures is formed on a substrate and a plurality of doped regions is formed in the substrate beside the stack gate structures. Then, a plurality of spacers is formed on the sidewalls of the stack gate structures. After that, a plurality of conductive pad layers is formed on the exposed doped regions. By forming the conductive pad layers, the resistance of the doped region in each memory cell can be reduced.

11 Claims, 5 Drawing Sheets

NON-VOLATILE MEMORY CELL AND FABRICATING METHOD THEREOF AND METHOD OF FABRICATING NON-VOLATILE MEMORY

BACKGROUND OF THE INVENTION

1. Field of the Invention

The present invention relates to a memory device and fabricating method thereof. More particularly, the present invention relates to a non-volatile memory cell and fabricating method thereof and a method of fabricating a non-volatile memory.

2. Description of the Related Art

Among the semiconductor application devices, non-volatile memory is a device occupying a small volume, having a fast data access speed and consuming very little power. Therefore, non-volatile memory devices have been used for the mass storage of data inside many portable palm-top terminals including digital still cameras and memory cards in recent years.

Typically, a non-volatile memory comprises a plurality of memory cells aligned to form an array. The memory cells on a horizontal row are serially connected together through a word line and the memory cells on a vertical column are serially connected through a bit line. Furthermore, the stripe-shape source/drain regions buried inside the substrate serve as buried bit lines. However, to increase the level of integration of the devices, the dimensions of each device are reduced. As a result, the resistance of the source/drain regions (the buried bit lines) gradually increases and the performance of the device deteriorates.

Because the source/drain regions are buried in the substrate, electrical contact with any external device has to be made through a contact. Yet, with the miniaturization of devices, the process of fabricating contacts is increasingly difficult.

SUMMARY OF THE INVENTION

Accordingly, at least one objective of the present invention is to provide a method of fabricating a non-volatile memory cell capable of resolving problems resulting from an increase in the level of integration of the memory cell devices.

At least a second objective of the present invention is to provide a non-volatile memory cell capable of reducing the resistance of the doped regions within the memory cell.

At least a third objective of the present invention is to provide a method of fabricating a non-volatile memory capable of integrating a memory cell region with a peripheral circuit region.

To achieve these and other advantages and in accordance with the purpose of the invention, as embodied and broadly described herein, the invention provides a method of fabricating a non-volatile memory cell. The fabricating method includes the following steps. First, a plurality of stack gate structures is formed on a substrate. Each stack gate structure comprises a bottom dielectric layer, a charge storage layer, a top dielectric layer and a control gate layer sequentially disposed over the substrate. Thereafter, a plurality of doped regions is formed in the substrate beside the stack gate structures. Then, a plurality of spacers is formed on the sidewalls of the stack gate structures. After that, a plurality of conductive pad layers is formed on the exposed doped regions.

According to the method of fabricating the non-volatile memory cell in the preferred embodiment of the present invention, the conductive pad layer comprises a silicon layer and a silicide layer over the silicon layer. The method of forming the conductive pad layers includes depositing a silicon material layer over the substrate to cover the stack gate structures, the spacers and the exposed doped regions. Then, a portion of the silicon material layer is removed. Thereafter, a metallic layer is formed over the remaining silicon material layer. The metallic layer is a cobalt layer, a tungsten layer or a titanium layer, for example. After that, a thermal processing treatment is carried out.

According to the method of fabricating the non-volatile memory cells in the preferred embodiment of the present invention, the doped regions is buried bit lines, for example.

According to the method of fabricating the non-volatile memory cells in the preferred embodiment of the present invention, a plurality of dielectric layers is formed over the conductive pad layers after forming the conductive pad layers.

By forming a conductive pad layer over the doped regions, the resistance of the doped regions (the buried bit lines) is reduced. Furthermore, the conductive pad layers also facilitates the fabrication of contacts in a subsequent contact process.

The present invention also provides a non-volatile memory cell structures comprising a substrate, a plurality of stack gate structures, a plurality of doped regions, a plurality of conductive pad layers and a plurality of spacers. The stack gate structures are disposed on the substrate. Each stack gate structure comprises a bottom dielectric layer, a charge storage layer, a top dielectric layer and a control gate layer sequentially disposed over the substrate. The doped regions are disposed in the substrate beside the stack gate structures. The conductive pad layers are disposed on the doped regions. The spacers are disposed on the sidewalls of the stack gate structures between the conductive pad layer and the stack gate structure.

According to the non-volatile memory cell in the preferred embodiment of the present invention, the conductive pad layer comprises a silicon layer and a silicide layer over the silicon layer. The silicide layer can be a cobalt silicide layer, a tungsten silicide layer or a titanium silicide layer, for example.

According to the non-volatile memory cell in the preferred embodiment of the present invention, the doped regions is buried bit lines, for example.

According to the non-volatile memory cell in the preferred embodiment of the present invention, a plurality of dielectric layers is additionally formed over the conductive pad layers.

By forming a conductive pad layer over the doped regions of a non-volatile memory cell, the resistance of the doped regions (the buried bit lines) is reduced.

The present invention also provides a method of fabricating a non-volatile memory. The method includes the following steps. First, a substrate having a memory cell region and a peripheral circuit region is provided. Then, a plurality of first stack gate structures is formed on the substrate within the memory cell region. Each first stack gate structure comprises a bottom dielectric layer, a charge storage layer, a top dielectric layer and a control gate layer sequentially formed over the substrate. A plurality of second stack gate structures is also formed on the substrate within the peripheral circuit region. Each second stack gate structure comprises a gate dielectric layer and a gate layer sequentially formed over the substrate. Thereafter, a plurality of first doped regions is formed in the substrate beside the first stack gate structures and a plurality of second doped regions is formed in the substrate beside the second stack gate structures. Then, a plurality of first spacers is formed on the sidewalls of the first stack gate structures and a plurality of second spacers is formed on the sidewalls of the second stack gate structures. After that, a plurality of first conductive pad layers is formed over the exposed first doped regions and a plurality of second conductive pad layers is formed over the exposed second doped regions. Each first conductive pad layer and each second conductive pad layer comprise a silicon layer and a silicide layer over the silicon layer.

According to the method of fabricating the non-volatile memory in the preferred embodiment of the present invention, the method of forming the first conductive pad layers and the second conductive pad layers includes forming a silicon material layer over the substrate to cover the first stack gate structures, the second stack gate structures, the first spacers, the second spacers and the exposed first doped regions and the second doped regions. Then, a portion of the silicon material layer is removed. Thereafter, a metallic layer is formed over the remaining silicon material layer. The metallic layer is fabricated using cobalt, tungsten or titanium, for example. After that, a thermal processing treatment is carried out.

According to the method of fabricating the non-volatile memory in the preferred embodiment of the present invention, the first doped regions is buried bit lines.

According to the method of fabricating the non-volatile memory in the preferred embodiment of the present invention, a plurality of dielectric layers is additionally formed over the first conductive pad layers after forming the first conductive pad layers and the second conductive pad layers.

By forming a conductive pad layer over the doped regions of a non-volatile memory, the resistance of the doped regions (the buried bit lines) is reduced. Furthermore, through the aforementioned method, the process of fabricating devices on the memory cell region and the peripheral circuit region of a semiconductor chip can be integrated together.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
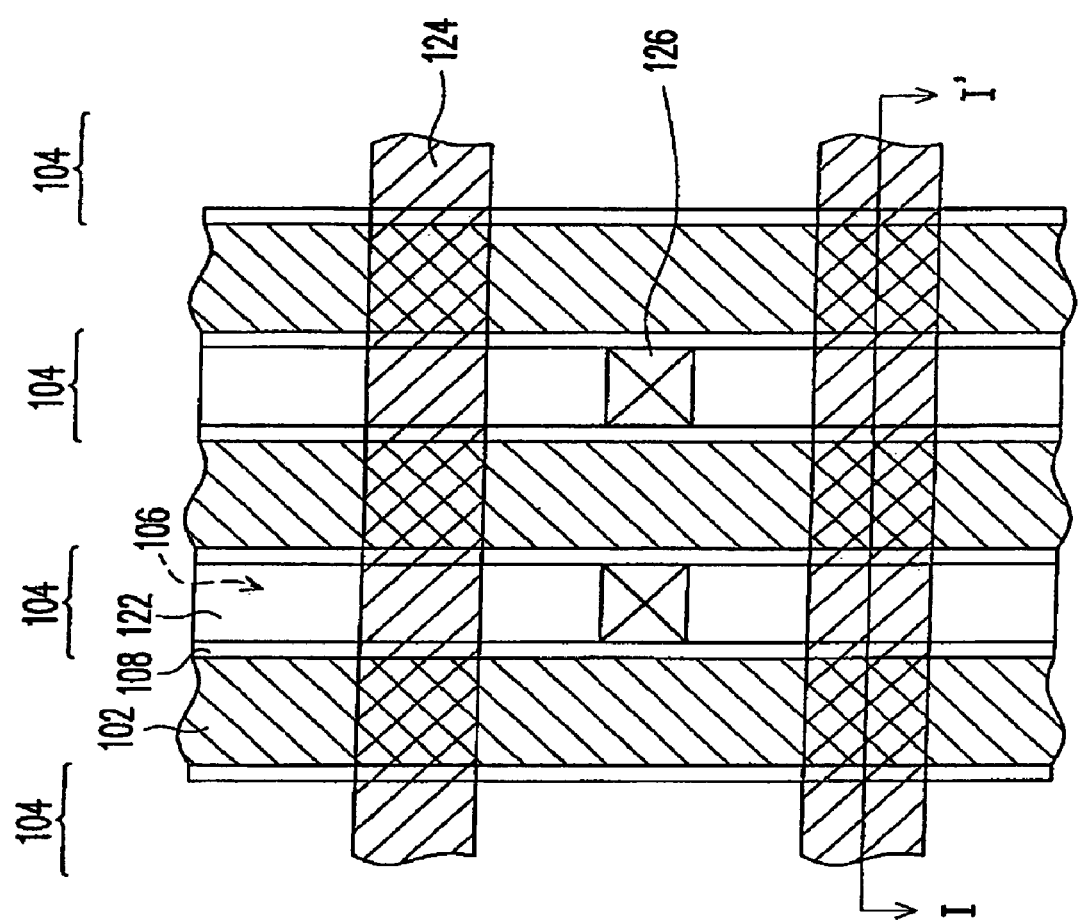
FIG. 1 is a top view showing the memory cell region of a non-volatile memory according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
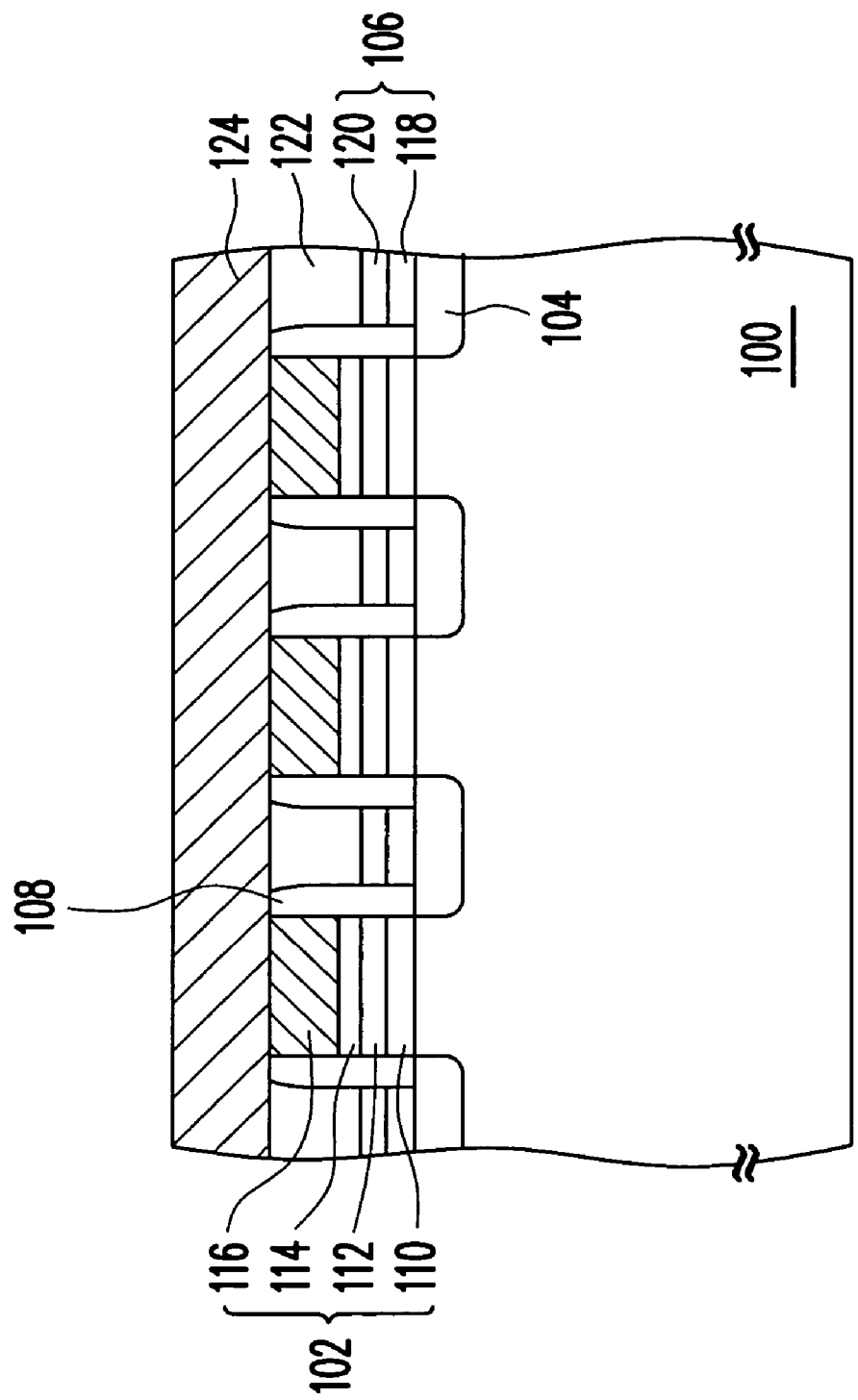
FIG. 2 is a schematic cross-sectional view along line I-I' of FIG. 1.

FIG. 1 is a top view showing the memory cell region of a non-volatile memory according to one preferred embodiment of the present invention. FIG. 2 is a schematic cross-sectional view along line I-I' of FIG. 1. As shown in FIGS. 1 and 2, the memory cells within the non-volatile memory cell region of the non-volatile memory in the present invention comprises a substrate 100, a plurality of stack gate structures 102, a plurality of doped regions 104, a plurality of conductive pad layers 106 and a plurality of spacers 108.

The substrate 100 is a silicon substrate, for example. The stack gate structure 102 is disposed on the substrate 100. The stack gate structure 102 comprises a bottom dielectric layer 110, a charge storage layer 112, a top dielectric layer 114 and a control gate layer 116 sequentially disposed over the substrate 100. In one embodiment, the bottom dielectric layer 110 is a tunneling layer fabricated using silicon oxide, for example; the charge storage layer 112 is a charge-trapping layer fabricated using silicon nitride, for example; the top dielectric layer 114 is a charge barrier layer fabricated using silicon oxide, for example; and, the control gate layer 116 is a doped polysilicon layer so that a silicon nitride read-only-memory cell is produced. In another embodiment, the bottom dielectric layer is a tunneling layer fabricated using silicon oxide, for example; the charge storage layer 112 is a floating gate layer fabricated using doped polysilicon, for example; the top dielectric layer 114 is an inter-gate dielectric layer fabricated using a composite film stack of silicon oxide/silicon nitride/silicon oxide, for example; and, the control gate layer 116 is a doped polysilicon layer so that a flash memory cell is produced.

The doped regions 104 are disposed in the substrate 100 beside the stack gate structure 102. The doped regions 104 can be regarded as the source/drain regions of a single memory cell (one single stack gate structure 102) or can be regarded as the buried bit lines for connecting a plurality of memory cells.

In addition, the conductive pad layers 106 are disposed on the doped regions 104. The conductive pad layers 106 can be a single metallic layer, a single conductive material layer or a stack layer comprising a silicon layer 118 and a silicide layer 120 disposed on the silicon layer 118. The silicide layer 120 can be a cobalt silicide layer, a tungsten silicide layer or a titanium silicide layer, for example. Due to the presence of a conductive pad layer 106 on the doped regions 104, the resistance of the doped regions 104 is reduced and the electrical performance of the device is improved.

The spacers 108 are disposed on the sidewalls of the stack gate structure 102 between the conductive pad layers 106 and the stack gate structure 102. The spacers are fabricated using an insulating material such as silicon nitride, for example.

Furthermore, the memory cell of the present invention may include a dielectric layer 122 disposed on the conductive pad layers 106. The dielectric layer 122 completely fills the gap between two adjacent stack gate structures 102. In one embodiment, the memory cell may include a word line 124 disposed over the dielectric layer 122 and the stack gate structure 102 for connecting the control gate layers 116 of various memory cells (the stack gate structures 102). Since the doped regions 104 serving as the source/drain regions are buried in the substrate 100, contacts 126 may also form in the dielectric layer 122. Thus, the doped regions 104 may form electrical connections with external devices through the contacts 126.

Because a conductive pad layer is formed on the doped regions of the memory cell in the present invention, the resistance of the doped regions is reduced and the electrical performance of the device is increased.

Figure 3A:
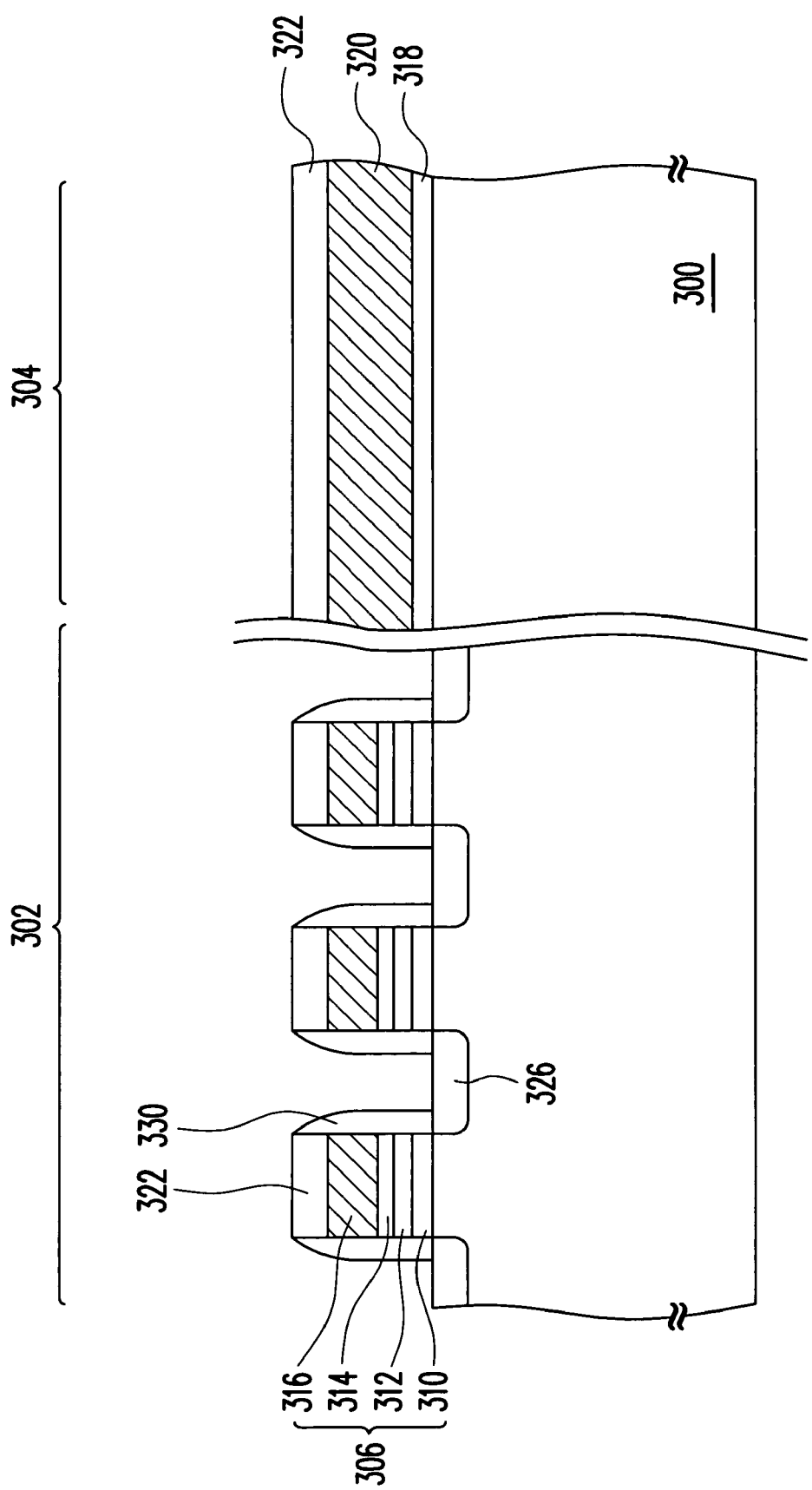
FIGS. 3A through 3C are schematic cross-sectional views showing the steps for fabricating a non-volatile memory according to one preferred embodiment of the present invention.
Figure 3B:
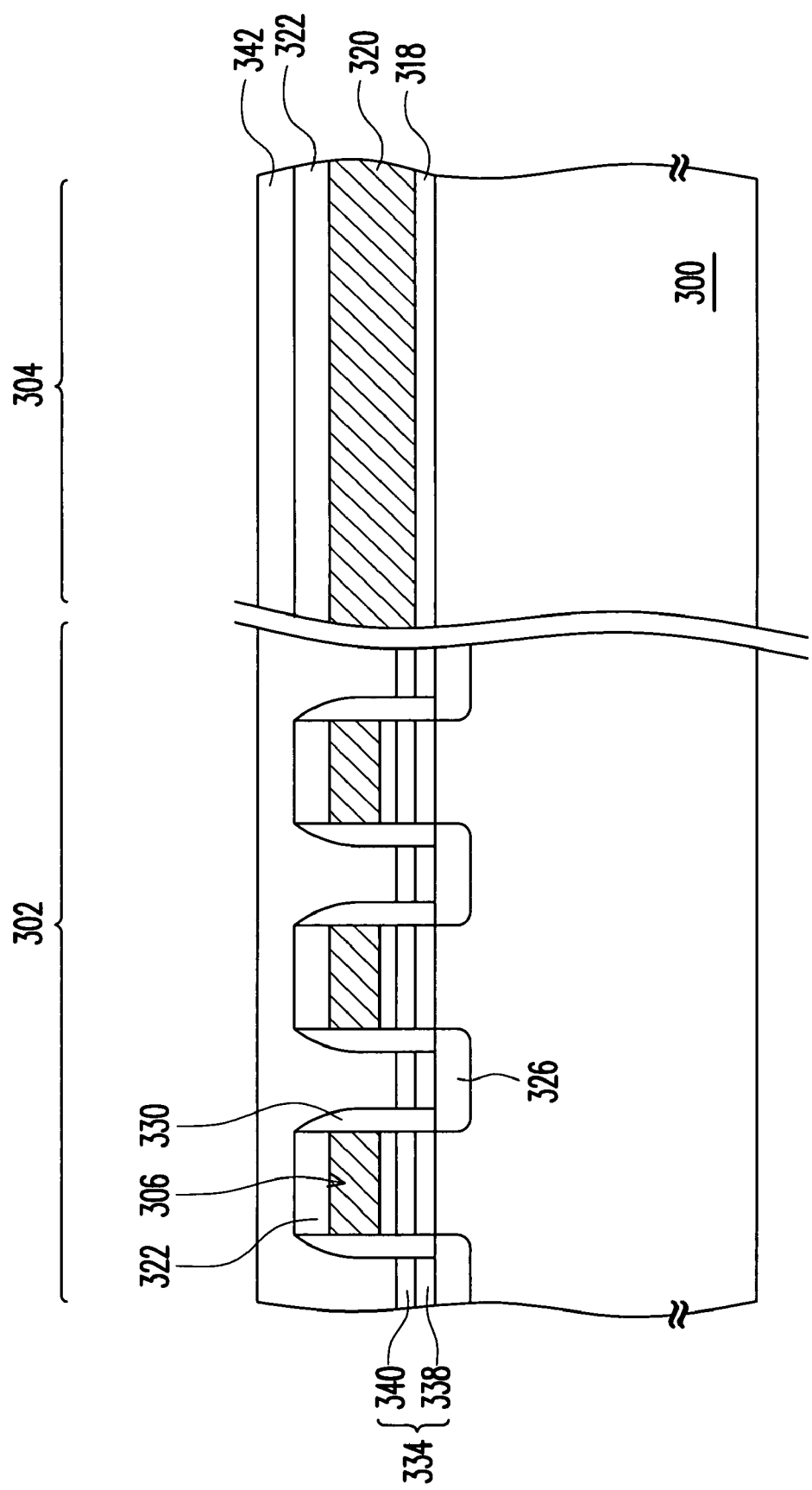
Figure 3C:
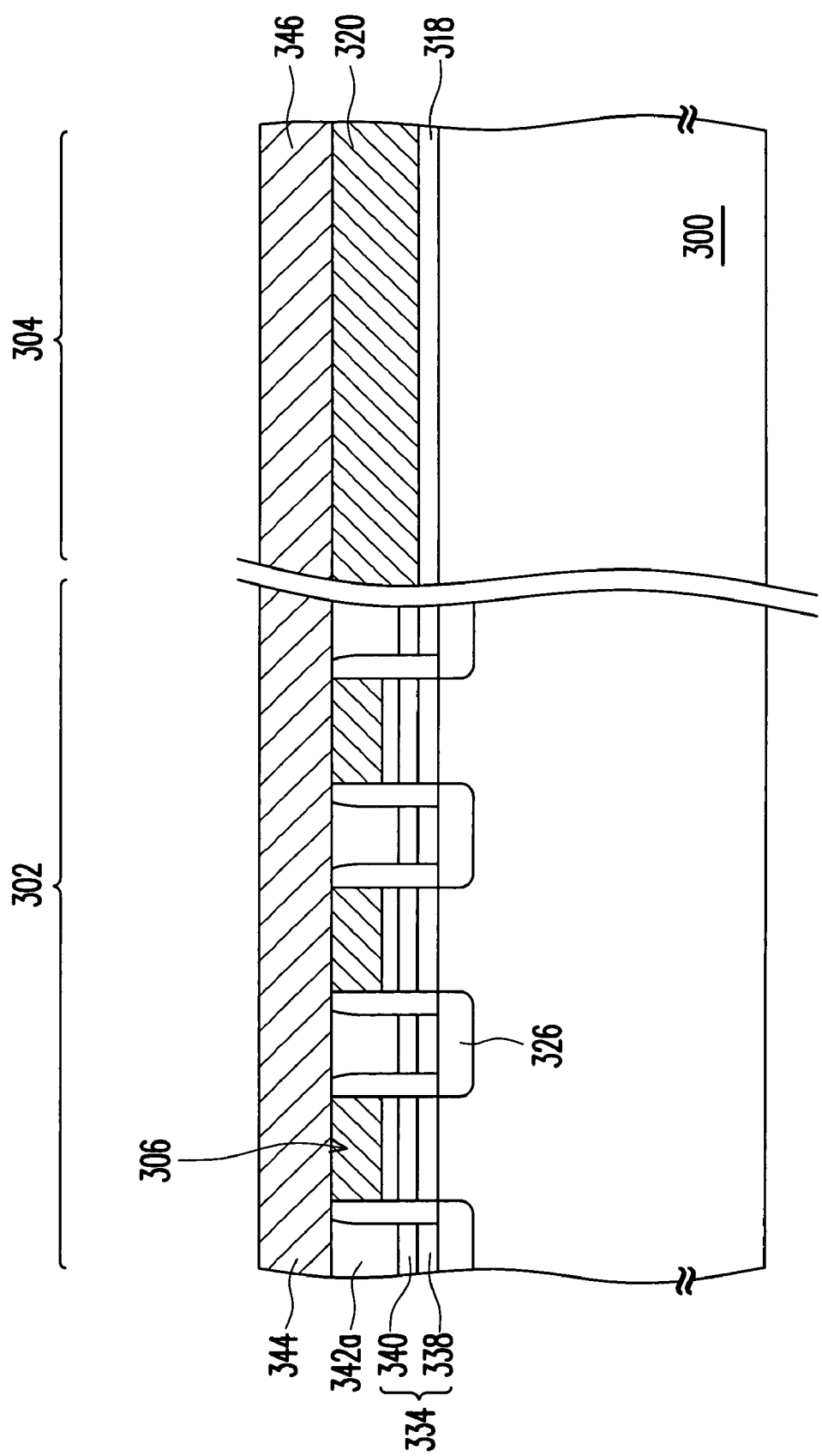

FIGS. 3A through 3C are schematic cross-sectional views showing the steps for fabricating a non-volatile memory according to one preferred embodiment of the present invention. In the following, the process of fabricating the peripheral circuit region is also described aside from the process of fabricating the memory cell region. As shown in FIG. 3A, a substrate 300 comprising a memory cell region 302 and a peripheral circuit region 304 is provided. Then, a plurality of stack gate structures 306 is formed on the substrate 300 in the memory cell region 302 and a plurality of stack gate structures 308 is formed on the substrate 300 in the peripheral circuit region 304. Each stack gate structure 306 comprises a bottom dielectric layer 310, a charge storage layer 312, a top dielectric layer 314 and a control gate layer 316 formed over the substrate 300. On the other hand, each stack gate structure 308 comprises a gate dielectric layer 318 and a gate layer 320 sequentially formed over the substrate 300. The method of forming the stack gate structures 306 and 308 includes performing a patterning operation using respective mask layers 322 and 324, for example.

In one embodiment, the bottom dielectric layer 310 is a tunneling layer fabricated using silicon oxide, for example, the charge storage layer 312 is a charge-trapping layer fabricated using silicon nitride, for example; the top dielectric layer 314 is a charge barrier layer fabricated using silicon oxide, for example; and, the control gate layer 316 is fabricated using doped polysilicon so that a silicon nitride read-only memory cell is produced. In another embodiment, the bottom dielectric layer 310 is a tunneling layer fabricated using silicon oxide, for example; the charge storage layer 312 is a floating gate layer fabricated using doped polysilicon, for example; the top dielectric layer 314 is an inter-gate dielectric layer fabricated using silicon oxide, for example; and, the control gate layer 316 is fabricated using doped polysilicon so that a flash memory cell is produced.

Thereafter, doped regions 326 and 328 are formed in the substrate 300 beside the stack gate structures 306 and 308. The method of forming the doped regions 326 and 328 includes performing an ion implant process using the stack gate structures 306 and 308 as a mask. The doped regions 326 in the memory cell region 302 can be regarded as source/drain regions for a single memory cell (single stack gate structure 306) and can be regarded as buried bit lines for connecting the memory cells in an array.

After that, spacers 330 and 332 are formed on the respective sidewalls of the stack gate structures 306 and 308. The spacers 330 and 332 are fabricated using an insulating material such as silicon nitride, for example. The method of forming the spacers 330 and 332 includes depositing spacer material over the entire structure to form a spacer material layer (not shown) and performing an anisotropic etching operation thereafter.

As shown in FIG. 3B, conductive pad layers 334 and 336 are formed on the exposed doped regions 326 and 328 respectively. The conductive pad layers 334, 336 can be a single metallic layer, a single conductive material layer or a stacked layer comprising a silicon layer 338 and a silicide layer 340 disposed on the silicon layer 338. The silicide layer 340 can be fabricated using cobalt silicide, tungsten silicide or titanium silicide, for example. The method of forming stacked conductive pad layers 334, 336 includes deposition silicon material over the substrate 300 to form a silicon material layer (not shown) that covers the stack gate structures 306, 308, the spacers 330, 332 and the exposed doped regions 326, 328. Then, a portion of the silicon material layer is removed by performing an etching back operation, thereby forming the silicon layer 338. Thereafter, a metallic layer (not shown) is formed over the silicon layer 338 and then a thermal processing operation is carried out so that the metallic layer and the silicon layer 338 react to form the silicide layer 340. The metallic layer can be fabricated using cobalt, tungsten or titanium, for example.

The present invention utilizes the conductive pad layers 334 on the doped regions in the memory cell region or the conductive pad layers 336 on the doped region in the peripheral circuit region to lower the resistance of the doped regions and increase the electrical performance of the device.

Furthermore, instead of forming a silicide layer directly over the doped regions as in the conventional method, the present invention includes the step of forming a silicon layer over the doped regions before forming a silicide layer over the silicon layer. The silicon layer not only provides an effective means of controlling the thickness of the silicide layer, but also prevents the silicide layer from having a thickness greater than the depth of the doped region due to a conventional shallow doped region.

Thereafter, as shown in FIG. 3B, a dielectric layer 342 is formed over the substrate 300. The dielectric layer 342 can be fabricated using an insulating material such as silicon oxide or silicon nitride. The method of forming the dielectric layer 342 includes performing a chemical vapor deposition process, for example.

As shown in FIG. 3C, a portion of the dielectric layer 342 and the mask layers 322, 332 are removed. The method of removing a portion of the dielectric layer 342 and the mask layers 322, 332 includes performing a chemical-mechanical polishing operation using the stack gate structures 306, 308 as a polishing end point or using solvent removing.

In one embodiment, a word line 344 is also formed over the stack gate structures 306 and the dielectric layer 342a in the memory cell region 302 for electrically connecting various memory cells (the stack gate structures 306) after forming the dielectric layer 342a. In addition, a conductive layer 346 is formed on the gate layer 320 at the peripheral circuit region 304. Material for the word line 344 and the conductive layer 346 can be for example polysilicon. Furthermore, the doped regions 326 serving as the source/drain regions in the memory cell region 302 are buried within the substrate 300. Hence, a contact similar to the contact 126 shown in FIG. 1 can be fabricated in the dielectric layer 342a to connect the doped region 326 electrically with an external device. Moreover, with a conductive pad layers 334 already formed over the doped regions 326, the aspect ratio of the contact opening for forming the contact can be reduced.

It should be noted that the method for fabricating the memory cell according to the present invention could be applied alone or together with the fabrication of devices in the peripheral circuit region.

In summary, major advantages of the present invention at least include the following.

1. By forming a conductive pad layer over the doped region, the resistance of the doped region is reduced and the electrical performance of the device is improved.
2. A silicon layer is formed over the doped regions prior to forming the silicide layer on top. Hence, the silicon layer can provide an effective means of controlling the thickness of the silicide layer. Furthermore, the silicide layer is prevented from having a thickness greater than the depth of the doped region due to a conventional shallow doped region.

3. Due to the presence of a conductive pad layer over the doped regions, the process for fabricating contacts is facilitated because the aspect ratio of the contact opening necessary for forming the contact is reduced.

4. The method of fabricating memory cells can be applied alone or together with the fabrication of device in the peripheral circuit region.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a non-volatile memory cell, comprising the steps of:
   providing a substrate;
   forming a plurality of stack gate structures on the substrate, wherein each stack gate structure comprises a bottom dielectric layer, a charge storage layer, a top dielectric layer and a control gate layer sequentially disposed over the substrate;
   forming a plurality of doped regions in the substrate beside the stack gate structures;
   forming a plurality of spacers on the sidewalls of the stack gate structures;
   forming a plurality of conductive pad layers on the exposed doped regions;
   forming a dielectric layer on the substrate between the spacers; and
   forming a wordline on the dielectric layer to electrically connect to the control gate layers.

2. The method of claim 1, wherein the conductive pad layer comprises a silicon layer and a silicide layer over the silicon layer.

3. The method of claim 2, wherein the step for forming the conductive pad layers comprises:
   forming a silicon layer;
   removing a portion of the silicon layer;
   forming a metallic layer over the residual silicon layer; and
   performing a thermal processing operation to form the silicide layer.

4. The method of claim 3, wherein the material constituting the metallic layer is selected from a group consisting of cobalt, tungsten and titanium.

5. The method of claim 1, wherein the doped regions include buried bit lines.

6. The method of claim 1, wherein after the step of forming the conductive pad layers, further comprises forming a plurality of dielectric layers over the conductive pad layers.

7. A non-volatile memory cell, comprising:
   a substrate;
   a plurality of stack gate structures disposed on the substrate, wherein each stack gate structure comprises a bottom dielectric layer, a charge storage layer, a top dielectric layer and a control gate layer sequentially formed over the substrate;
   a plurality of doped regions disposed in the substrate beside the stack gate structures;
   a plurality of conductive pad layers disposed on the doped regions;
   a plurality of spacers disposed on the sidewalls of the stack gate structures between the various conductive pad layers and the stack gate structures;
   a dielectric layer is disposed on the substrate between the spacers; and
   a wordline is disposed on the dielectric layer and electrically connected to the control gate layers.

8. The non-volatile memory cell of claim 7, wherein the conductive pad layer comprises a silicon layer and a suicide layer disposed over the silicon layer.

9. The non-volatile memory cell of claim 8, wherein the material constituting the silicide layer is selected from a group consisting of cobalt silicide, tungsten silicide and titanium suicide.

10. The non-volatile memory cell of claim 7, wherein the doped regions include buried bit lines.

11. The non-volatile memory cell of claim 7, further comprises a plurality of dielectric layers disposed on the conductive pad layers.

* * * * *